(12) United States Patent
Liang et al.

(10) Patent No.: US 10,804,192 B2
(45) Date of Patent: *Oct. 13, 2020

(54) PROTRUSION BUMP PADS FOR BOND-ON-TRACE PROCESSING

(71) Applicant: Taiwan Semiconductor Manufacturing Company, Ltd., Hsinchu (TW)

(72) Inventors: Yu-Min Liang, Zhongli (TW); Jiun Yi Wu, Zhongli (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 2 days.

This patent is subject to a terminal disclaimer.

(21) Appl. No.: 16/228,928

(22) Filed: Dec. 21, 2018

(65) Prior Publication Data

US 2019/0122976 A1 Apr. 25, 2019

Related U.S. Application Data

(60) Continuation of application No. 15/003,632, filed on Jan. 21, 2016, now Pat. No. 10,163,774, which is a (Continued)

(51) Int. Cl.
*H01L 23/498* (2006.01)
*H01L 23/00* (2006.01)
(Continued)

(52) U.S. Cl.
CPC ........ *H01L 23/49838* (2013.01); *H01L 22/14* (2013.01); *H01L 23/481* (2013.01); *H01L 23/49822* (2013.01); *H01L 23/49894* (2013.01); *H01L 24/11* (2013.01); *H01L 24/17* (2013.01); *H01L 24/81* (2013.01); *H05K 1/0268* (2013.01); *H05K 1/113* (2013.01); *H05K 3/4007* (2013.01);
(Continued)

(58) Field of Classification Search
CPC . H01L 21/66; H01L 23/49838; H01L 23/481; H01L 23/49822; H01L 23/49894
See application file for complete search history.

(56) References Cited

U.S. PATENT DOCUMENTS 5,763,936 A 6/1998 Yamaha et al.
5,892,277 A 4/1999 Ikemizu et al.
(Continued)

FOREIGN PATENT DOCUMENTS

CN 102054811 A 5/2011
CN 102111952 A 6/2011
(Continued)

*Primary Examiner* — David A Zarneke
(74) *Attorney, Agent, or Firm* — Slater Matsil, LLP

(57) ABSTRACT

A die and a substrate are provided. The die comprises at least one integrated circuit chip, and the substrate comprises first and second subsets of conductive pillars extending at least partially therethrough. Each of the first subset of conductive pillars comprises a protrusion bump pad protruding from a surface of the substrate, and the second subset of conductive pillars each partially form a trace recessed within the surface of the substrate. The die is coupled to the substrate via a plurality of conductive bumps each extending between one of the protrusion bump pads and the die.

20 Claims, 5 Drawing Sheets

Related U.S. Application Data division of application No. 14/148,482, filed on Jan. 6, 2014, now Pat. No. 9,275,967.

(51) Int. Cl.

| | | |
|---|---|---|
| *H01L 23/48* | (2006.01) | |
| *H01L 21/66* | (2006.01) | |
| *H05K 1/02* | (2006.01) | |
| *H05K 1/11* | (2006.01) | |
| *H05K 3/40* | (2006.01) | |
| *H05K 3/46* | (2006.01) | |

(52) U.S. Cl.
CPC ... *H01L 23/49811* (2013.01); *H01L 23/49827* (2013.01); *H01L 24/02* (2013.01); *H01L 24/13* (2013.01); *H01L 24/16* (2013.01); *H01L 2224/0401* (2013.01); *H01L 2224/11614* (2013.01); *H01L 2224/11622* (2013.01); *H01L 2224/131* (2013.01); *H01L 2224/133* (2013.01); *H01L 2224/13144* (2013.01); *H01L 2224/13294* (2013.01); *H01L 2224/16225* (2013.01); *H01L 2224/16227* (2013.01); *H01L 2224/16235* (2013.01); *H01L 2224/16238* (2013.01); *H01L 2224/1712* (2013.01); *H01L 2224/17132* (2013.01); *H01L 2224/81424* (2013.01); *H01L 2224/81444* (2013.01); *H01L 2224/81447* (2013.01); *H01L 2224/81455* (2013.01); *H01L 2224/81466* (2013.01); *H01L 2224/81815* (2013.01); *H01L 2924/01057* (2013.01); *H01L 2924/01072* (2013.01); *H01L 2924/0533* (2013.01); *H01L 2924/0534* (2013.01); *H01L 2924/05042* (2013.01); *H01L 2924/05342* (2013.01); *H01L 2924/05432* (2013.01); *H01L 2924/05442* (2013.01); *H01L 2924/05994* (2013.01); *H01L 2924/14* (2013.01); *H01L 2924/1531* (2013.01); *H01L 2924/15787* (2013.01); *H01L 2924/2064* (2013.01); *H01L 2924/20641* (2013.01); *H05K 3/4682* (2013.01); *H05K 2201/0367* (2013.01); *H05K 2201/096* (2013.01); *H05K 2201/0989* (2013.01); *H05K 2201/10674* (2013.01); *H05K 2203/0353* (2013.01)

(56) References Cited

U.S. PATENT DOCUMENTS

| | | | |
|---|---|---|---|
| 6,087,251 A | | 7/2000 | Hsu |
| 6,118,180 A | | 9/2000 | Loo et al. |
| 6,348,398 B1 | | 2/2002 | Wang |
| 6,352,916 B1 | | 3/2002 | Tang et al. |
| 6,358,831 B1 | | 3/2002 | Liu et al. |
| 6,388,322 B1 | | 5/2002 | Goossen et al. |
| 6,465,886 B1 | | 10/2002 | Horiuchi et al. |
| 6,627,824 B1 | | 9/2003 | Lin |
| 6,797,615 B1 | | 9/2004 | Lous et al. |
| 6,951,773 B2 | | 10/2005 | Ho et al. |
| 7,112,524 B2 | | 9/2006 | Hsu et al. |
| 8,127,979 B1 | | 3/2012 | Wu et al. |
| 8,198,140 B2 | | 6/2012 | Murai et al. |
| 8,318,537 B2 | | 11/2012 | Pendse |
| 8,952,538 B2 | | 2/2015 | Matsuki |
| 9,275,967 B2 | * | 3/2016 | Liang ............... H05K 1/0268 |
| 9,418,928 B2 | | 8/2016 | Liang et al. |
| 9,799,621 B2 | | 10/2017 | Lee et al. |
| 10,014,270 B2 | | 7/2018 | Liang et al. |
| 10,020,276 B2 | | 7/2018 | Chen et al. |
| 10,049,954 B2 | | 8/2018 | Bang |
| 10,163,774 B2 | | 12/2018 | Liang et al. |
| 10,522,495 B2 | | 12/2019 | Liang et al. |
| 2002/0048944 A1 | | 4/2002 | Tang |
| 2002/0187585 A1 | | 12/2002 | Tsukada et al. |
| 2007/0080416 A1 | | 4/2007 | Yoshioka et al. |
| 2009/0020323 A1 | | 1/2009 | Chen et al. |
| 2009/0121349 A1 | | 5/2009 | Suzuki |
| 2011/0079922 A1 | | 4/2011 | Yu et al. |
| 2011/0101526 A1 | | 5/2011 | Hsiao et al. |
| 2011/0133334 A1 | | 6/2011 | Pendse |
| 2011/0155438 A1 | | 6/2011 | Ito et al. |
| 2011/0198114 A1 | | 8/2011 | Maeda et al. |
| 2011/0217842 A1 | | 9/2011 | Park et al. |
| 2012/0007232 A1 | | 1/2012 | Haba et al. |
| 2012/0098120 A1 | | 4/2012 | Yu et al. |
| 2012/0161330 A1 | | 6/2012 | Hlad et al. |
| 2012/0175774 A1 | | 7/2012 | West et al. |
| 2012/0326299 A1 | | 12/2012 | Topacio et al. |
| 2013/0328189 A1 | | 12/2013 | Pendse |
| 2014/0035095 A1 | | 2/2014 | Lin et al. |
| 2014/0151867 A1 | | 6/2014 | Lin et al. |
| 2015/0194405 A1 | | 7/2015 | Liang et al. |
| 2015/0351228 A1 | | 12/2015 | Park et al. |
| 2016/0093546 A1 | | 3/2016 | Pai et al. |
| 2017/0018521 A1 | | 1/2017 | Liang et al. |

FOREIGN PATENT DOCUMENTS

| | | |
|---|---|---|
| CN | 102164451 A | 8/2011 |
| TW | 200408080 A | 10/2004 |
| TW | 200625559 A | 7/2006 |
| TW | 201115700 A | 5/2011 |
| TW | 201208024 A | 2/2012 |
| TW | 201220989 A | 5/2012 |
| TW | 201246466 A1 | 11/2012 |
| TW | 201304026 A | 1/2013 |
| TW | M462949 U | 10/2013 |

* cited by examiner

PROTRUSION BUMP PADS FOR BOND-ON-TRACE PROCESSING

PRIORITY CLAIM

This application is a continuation of U.S. patent application Ser. No. 15/003,632, filed on Jan. 21, 2016, and entitled "Protrusion Bump Pads for Bond-on-Trace Processing," which is a divisional of U.S. patent application Ser. No. 14/148,482, filed on Jan. 6, 2014, now U.S. Pat. No. 9,275,967 issued on Mar. 1, 2016, and entitled "Protrusion Bump Pads for Bond-on-Trace Processing" which applications are incorporated herein by reference.

BACKGROUND

In Bond-on-Trace (BoT) processing, a singulated, integrated circuit (IC) chip is flipped and connected to bond pad portions of traces formed on another substrate. A subset of the traces, also known as skip lines, includes traces extending between the bond pad portions, such as for fan-out purposes. Thus, the trace pitch is less than the bond pad pitch. However, this resulted in solder bonds inadvertently bridging connections with adjacent traces, and made probe testing overly challenging as the trace pitch fell below the diameter of common testing probes.

SUMMARY OF THE INVENTION

The present disclosure introduces a method comprising separating a substrate from a carrier on which an additional substrate is formed. The separated substrate comprises a conductive layer on a top surface of the substrate and a plurality of conductive pillars each extending from a bottom surface of the substrate and through the substrate to the conductive layer. A protrusion bump pad is formed over each of a first subset of the conductive pillars by selectively removing the conductive layer except from over each of the first subset of conductive pillars.

The present disclosure also introduces an apparatus comprising a substrate and a plurality of conductive traces on a first side of the substrate. Conductive pillars extend through the substrate from a second side of the substrate to corresponding ones of the conductive traces. Bump pads protrude from a first subset of the conductive traces, whereas each of a second subset of the conductive traces is recessed within the first side of the substrate.

The present disclosure also introduces a method comprising providing a die and a substrate, wherein the die comprises at least one integrated circuit chip, and the substrate comprises first and second subsets of conductive pillars extending therethrough. Each of the first subset of conductive pillars comprises a protrusion bump pad protruding from a surface of the substrate, and the second subset of conductive pillars each partially form a trace recessed within the surface of the substrate. The die is then coupled to the substrate via a plurality of conductive bumps each extending between one of the protrusion bump pads and the die.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
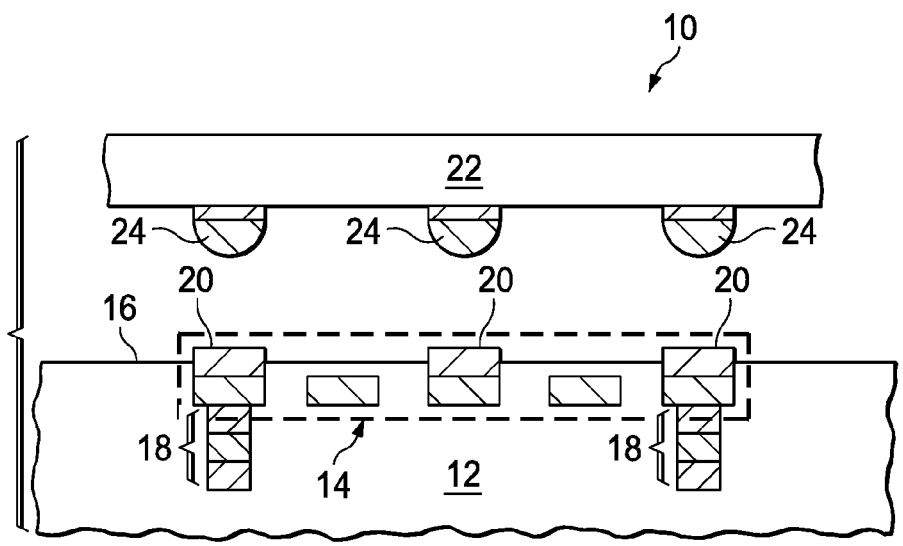
FIG. 1 is a sectional view of at least a portion of apparatus according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a sectional view of at least a portion of an apparatus 10 in an intermediate stage of manufacture according to one or more aspects of the present disclosure. The apparatus 10 comprises a substrate 12 and a plurality of conductive traces 14 disposed on a side 16 of the substrate. Conductive members 18 may extend into the substrate 12 from corresponding ones of the conductive traces 14. Bump pads 20 each protrude from one of a first subset of the conductive traces 14. Each of a second subset of the conductive traces 14 is recessed within the side 16 of the substrate 12. The apparatus 10 may further comprise an integrated circuit chip 22 and a plurality of conductive bumps 24 coupled between the integrated circuit chip and corresponding ones of the bump pads 20.

Figure 2:
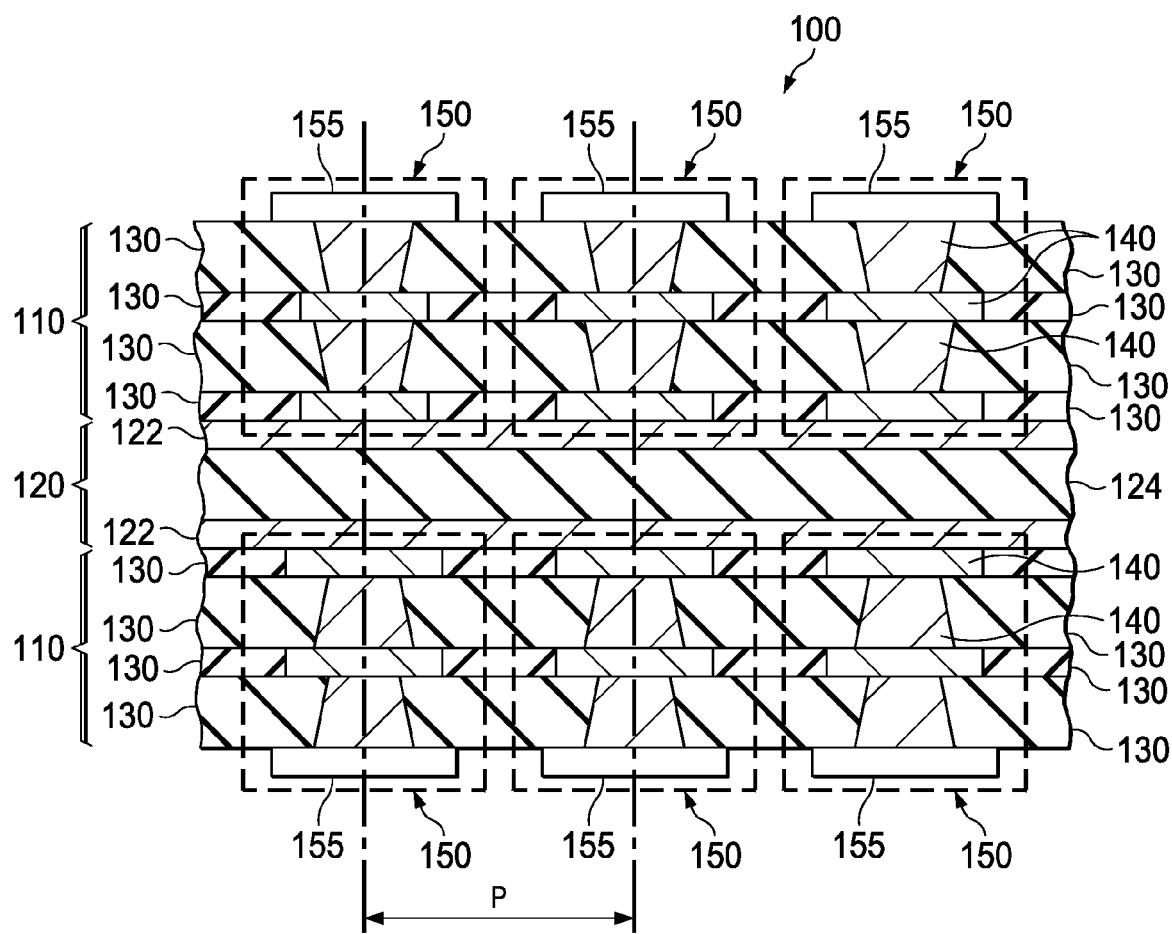
FIG. 2 is a sectional view of at least a portion of apparatus in an intermediate stage of manufacture according to one or more aspects of the present disclosure.

FIG. 2 is a sectional view of an implementation of the apparatus 10 shown in FIG. 1, herein designated by the reference numeral 100. The apparatus 100 is depicted in FIG. 2 as being in an intermediate stage of manufacture according to one or more aspects of the present disclosure. The apparatus 100 comprises build-up layers 110 on opposing sides of a carrier substrate 120. The carrier substrate 120 may comprise a coreless substrate, such as may comprise one or more metal layers 122 formed on one or both sides of an insulation layer 124. The insulation layer 124 and/or the carrier substrate 120 may comprise a single-sided or double-sided copper clad laminate (CCL), a prepreg or ajinomoto build-up film (ABF), paper, glass fiber, non-woven glass fabric, one or more layers of copper, nickel, aluminum, and/or other materials, elements, and/or compositions. The one or more metal layers 122 may comprise one or more layers of copper, nickel, aluminum, and/or other materials.

Among other components, the build-up layers 110 may comprise multiple dielectric layers 130 and metallization layers 140. Portions of the metallization layers 140 are vertically aligned to form conductive pillars 150.

The dielectric layers 130 may comprise a prepreg or ajinomoto build-up film (ABF). Alternatively, or additionally, the dielectric layers 130 may comprise paper, glass fiber, and/non-woven glass fabric, one or more of which may be applied by lamination. Alternatively, or additionally, the dielectric layers 130 may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. The dielectric layers 130 may be formed by sputtering, spin-on coating, chemical vapor deposition (CVD), low-pressure CVD, rapid thermal CVD, atomic layer CVD, and/or plasma enhanced CVD, perhaps utilizing tetraethyl orthosilicate and oxygen as a precursor. The dielectric layers 130 may also be formed by an oxidation process, such as wet or dry thermal oxidation in an ambient environment comprising an oxide, water, nitric oxide, or a combination thereof, and/or other processes. Fabrication of the dielectric layers 130 may also comprise chemical-mechanical polishing or planarizing (hereafter collectively referred to as CMP), isotropic etching, and/or anisotropic etching, among other processes. The dielectric layers 130 may be formed to a thickness ranging between about eight angstroms and about 200 angstroms, although other thicknesses are also within the scope of the present disclosure.

The metallization layers 140 may comprise one or more of copper, titanium, aluminum, nickel, gold, alloys and/or combinations thereof, and/or other materials. The metallization layers 140 may be formed by plating, perhaps to a thickness ranging between about four microns and about 25 microns. Alternatively, or additionally, the metallization layers 140 may be formed by CVD and/or other processes, and may have a thickness ranging between about eight angstroms and about 200 angstroms, although other thicknesses are also within the scope of the present disclosure.

The conductive pillars 150 and/or bond pads 155 thereof may have diameter and/or other lateral dimension ranging between about 150 microns and about 400 microns. The bond pads 155 may each be a BGA (ball grid array) pad, such as may be subsequently utilized in forming an interconnection with a "mother board" PCB (printed circuit board) and/or another PCB, PWB (printed wiring board), PCA (printed circuit assembly), PCBA (PCB assembly), CCA (circuit card assembly), backplane assembly, and/or apparatus. A pillar pitch P, or the lateral offset between neighboring conductive pillars 150 and/or bond pads 155, may range between about 300 microns and about 500 microns.

Figure 3:
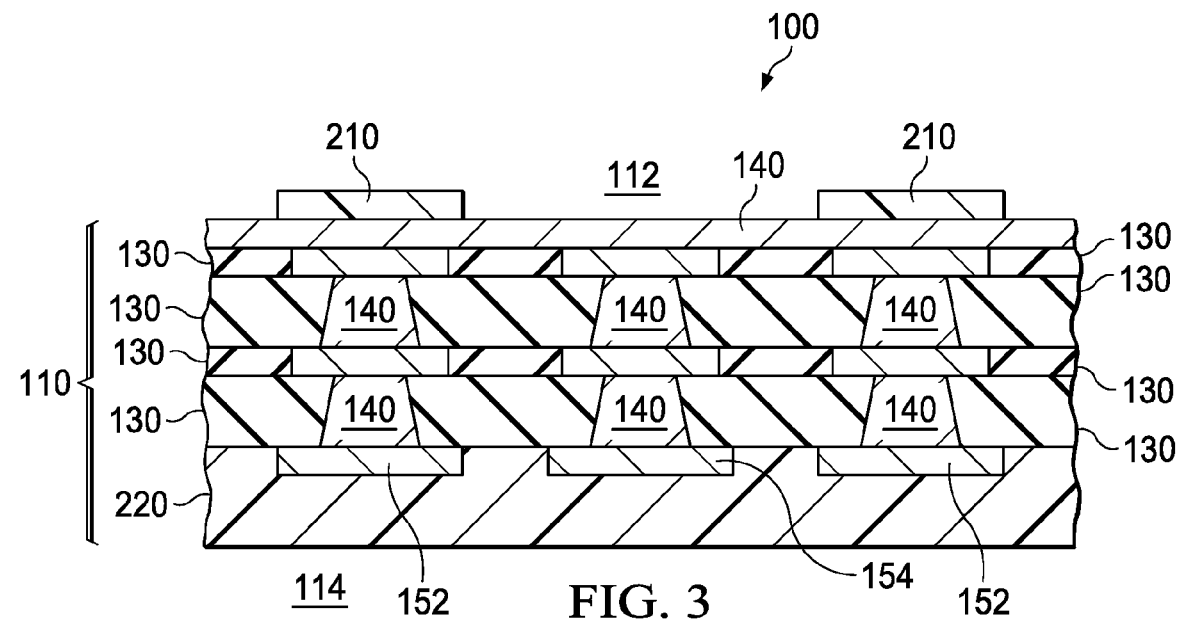
FIG. 3 is a sectional view of the apparatus shown in FIG. 2 in a subsequent stage of manufacture according to one or more aspects of the present disclosure.

FIG. 3 is a sectional view of the apparatus 100 shown in FIG. 2 in a subsequent stage of manufacture according to one or more aspects of the present disclosure, in which the sections of build-up layers 110 have been removed from the carrier substrate 120. One of the sections of build-up layers 110 is not shown in FIG. 3, although this is merely for the sake of simplifying the following discussion, and a person having ordinary skill in the art will readily recognize that both sections of the build-up layers 110 may be processed according to one or more of the aspects of the present disclosure. The build-up layers 110 may be removed from the carrier substrate 120 by routing, melting, mechanical force, etching and/or other processes.

A photoresist layer may then be coated, exposed, and developed on one or both sides of the build-up layers 110. For example, photoresist portions 210 may be formed on a first side 112 of the build-up layers 110, and a photoresist layer 220 may substantially cover a second side 114 of the build-up layers 110. The conductive pillars 150 may be divided between a first subset and a second subset. In FIG. 3, the first subset comprises conductive pillars 152, and the second subset comprises conductive pillar 154. The first subset will comprise more than the two conductive pillars 152 depicted in FIG. 3, and the second subset will comprise more than the one conductive pillar 154 depicted in FIG. 3.

The photoresist portions 210 on the first side 112 of the build-up layers 110 are formed over each conductive pillar 152 of the first subset, whereas the conductive pillars 154 of the second subset and the remaining surface features on the first side 112 of the build-up layers 110 may remain exposed to the subsequent lithographic processing. The photoresist portions 210 and layer 220 may comprise a chemically amplified photoresist or a non-chemically amplified photoresists, and may be positive-tone or negative tone. Processing of the photoresist portions 210 and layer 220 may comprise a deposition process including, for example, lamination of a dry film type photoresist, spin-on-coating, dip coating, brush coating, and/or ink-jet dispensing, among others. A post deposition baking step may be performed to remove solvent and/or other unwanted components, such as to a temperature ranging between about 40° C. and about 200° C., perhaps for a baking time ranging between about 10 seconds and about 10 minutes.

Figure 4:
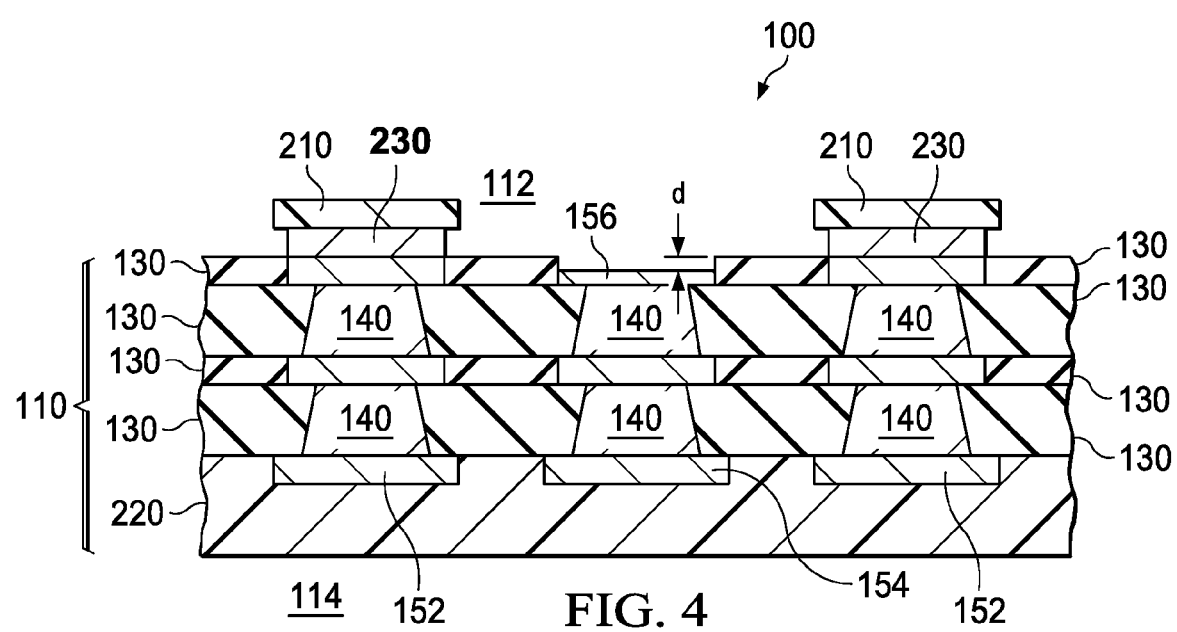
FIG. 4 is a sectional view of the apparatus shown in FIG. 3 in a subsequent stage of manufacture according to one or more aspects of the present disclosure.

FIG. 4 is a sectional view of the apparatus 100 shown in FIG. 3 in a subsequent stage of manufacture according to one or more aspects of the present disclosure, in which the photoresist portions 210 over the conductive pillars 152 of the first subset have been utilized as a mask during an etching process. The etching process is utilized to remove the portions of the outermost metallization layers 140 that are not protected by the photoresist portions 210 and layer 220. Thus, on the first side 112 of the build-up layers 110, the outermost metallization layer 140 is removed down to the outermost dielectric layer 130. However, the etching of the outermost metallization layer 140 over the conductive pillars 154 of the second subset is continued for a sufficient time so as to recess the exposed surface 156 of the conductive pillars 154 within the outer surface of the outermost dielectric layer 130. The exposed surface 156 of the second subset of conductive pillars 154 thus forms a portion of a recessed trace, whereas the masked portion of each of the first subset of conductive pillars 152 forms a protrusion bump pad 230. The depth d of the recess over the recessed trace, below the surface of the surrounding dielectric layer 130, may be less than about seven microns, such as about four microns, although other depths are also within the scope of the present disclosure.

Figure 5:
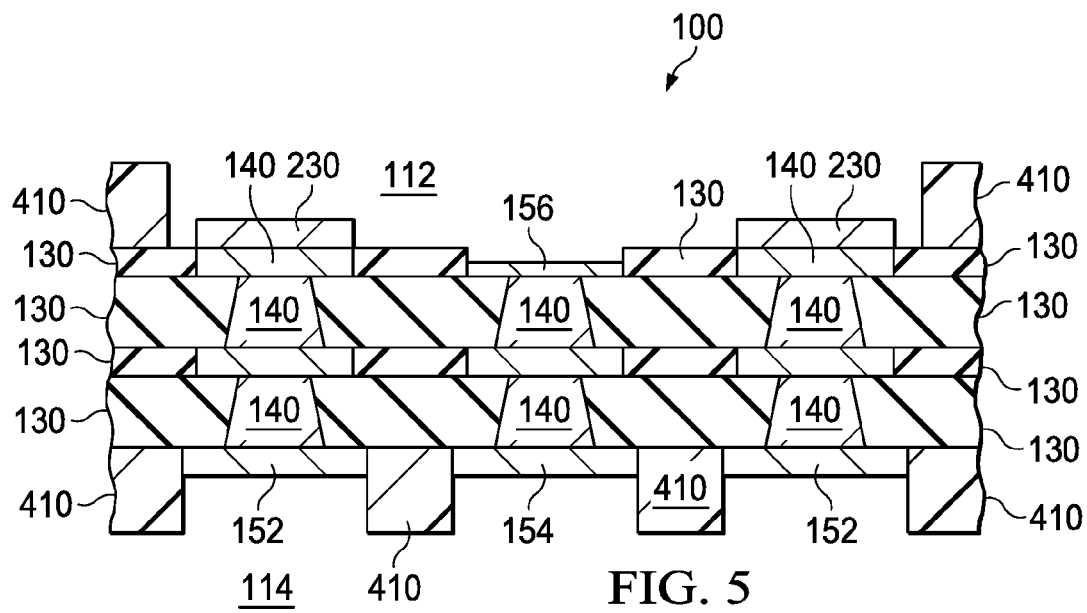
FIG. 5 is a sectional view of the apparatus shown in FIG. 4 in a subsequent stage of manufacture according to one or more aspects of the present disclosure.

FIG. 5 is a sectional view of the apparatus 100 shown in FIG. 4 in a subsequent stage of manufacture according to one or more aspects of the present disclosure, in which the photo resist portions 210 and the photoresist layer 220 have been removed, and solder resist portions 410 have been formed by conventional means. The solder resist portions 410 may comprise a heat-resistant coating material, and may aid in protecting the underlying layers.

Figure 6:
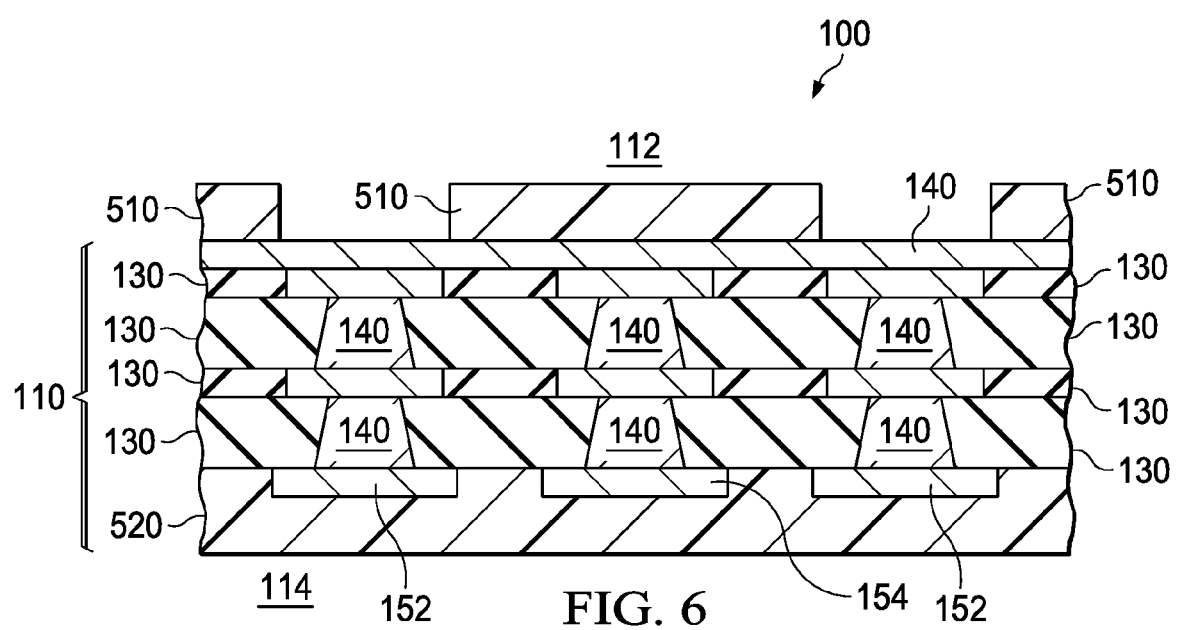
FIG. 6 is a sectional view of the apparatus shown in FIG. 2 in a subsequent stage of manufacture according to one or more aspects of the present disclosure.
Figure 7:
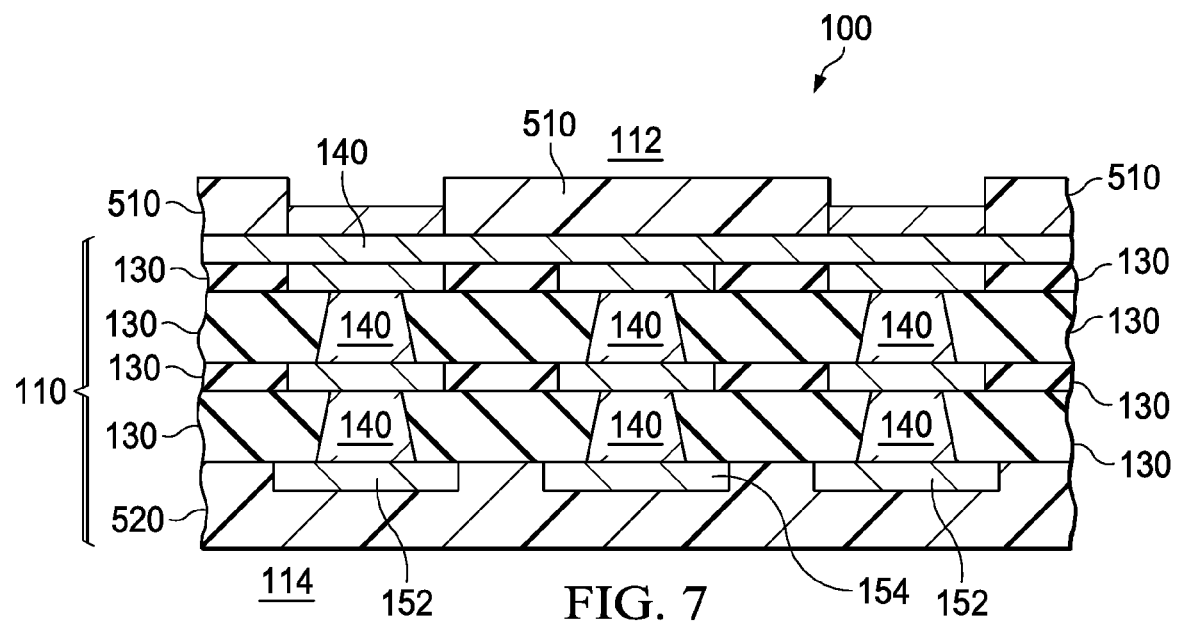
FIG. 7 is a sectional view of the apparatus shown in FIG. 6 in a subsequent stage of manufacture according to one or more aspects of the present disclosure.
Figure 8:
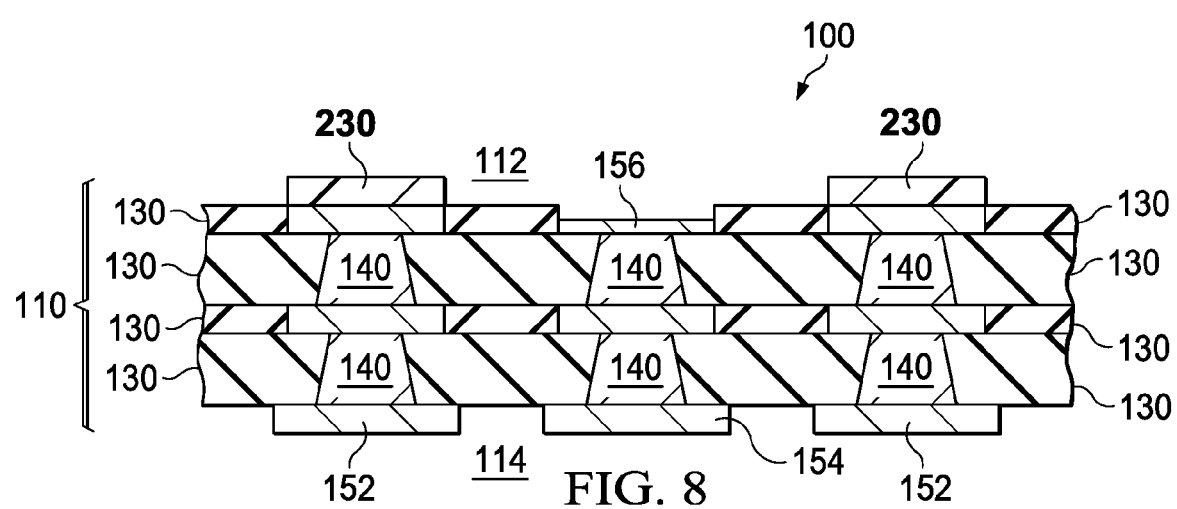
FIG. 8 is a sectional view of the apparatus shown in FIG. 7 in a subsequent stage of manufacture according to one or more aspects of the present disclosure.

Other methods of forming the protrusion bump pads 230 and recessed traces 156 are also within the scope of the present disclosure. One such example is depicted in FIGS. 6-8. FIG. 6 is a sectional view of the apparatus 100 shown in FIG. 2 in a subsequent stage of manufacture according to one or more aspects of the present disclosure. As above, the build-up layers 110 have been removed from the carrier substrate 120. A photoresist layer may then be coated, exposed, and developed on one or both sides of the build-up layers 110. For example, photoresist portions 510 may be formed on the first side 112 of the build-up layers 110, and a photoresist layer 520 may substantially cover the second side 114 of the build-up layers 110. The photoresist portions 510 on the first side 112 of the build-up layers 110 may substantially cover the entire first side 112, including over each conductive pillar 154 of the second subset, except for over the conductive pillars 152 of the first subset, which remain exposed for subsequent processing.

FIG. 7 is a sectional view of the apparatus 100 shown in FIG. 6 in a subsequent stage of manufacture according to one or more aspects of the present disclosure, in which the photoresist portions 510 have been utilized as a mask during a metallization process. The metallization process is utilized to add metal to the exposed conductive pillars 152 of the first subset. The material added by the metallization process may comprise one or more of copper, titanium, aluminum, nickel, gold, alloys and/or combinations thereof, and/or other materials. The metallization may be formed by electroplating, electroless plating, CVD, epitaxial growth, and/or other processes, and may add material to the conductive pillars 152 to a thickness ranging between about five microns and about 50 microns, although other thicknesses are also within the scope of the present.

FIG. 8 is a sectional view of the apparatus 100 shown in FIG. 7 in a subsequent stage of manufacture according to one or more aspects of the present disclosure, in which the photoresist portions 510 and the photoresist layer 520 have been removed. FIG. 8 also reflects the result of an etching process selective to the conductive pillars 152 of the first subset, the conductive pillars 154 of the second subset, and the outermost metallization layer 140. For example, the outermost metallization layer 140 is removed down to the outermost dielectric layer 130, including to a degree sufficient to recess the exposed surface 156 of the second subset of conductive pillars 154 within the outer surface of the outermost dielectric layer 130. As above, the exposed surface 156 of the second subset of conductive pillars 154 forms a portion of a recessed trace, whereas the now protruding portion of each of the first subset of conductive pillars 152 forms a protrusion bump pad 230. The tops of the conductive pillars (the protruding pillars) are also etched back during this process. Therefore, the process step of adding metallization, illustrated in FIG. 7, should be adjusted to ensure that sufficient height of the protruding pillars remains, even after this subsequent etch step. Additional processing may ensue, such as to form solder resist portions and/or otherwise arrive at the embodiment depicted in FIG. 5.

Figure 9:
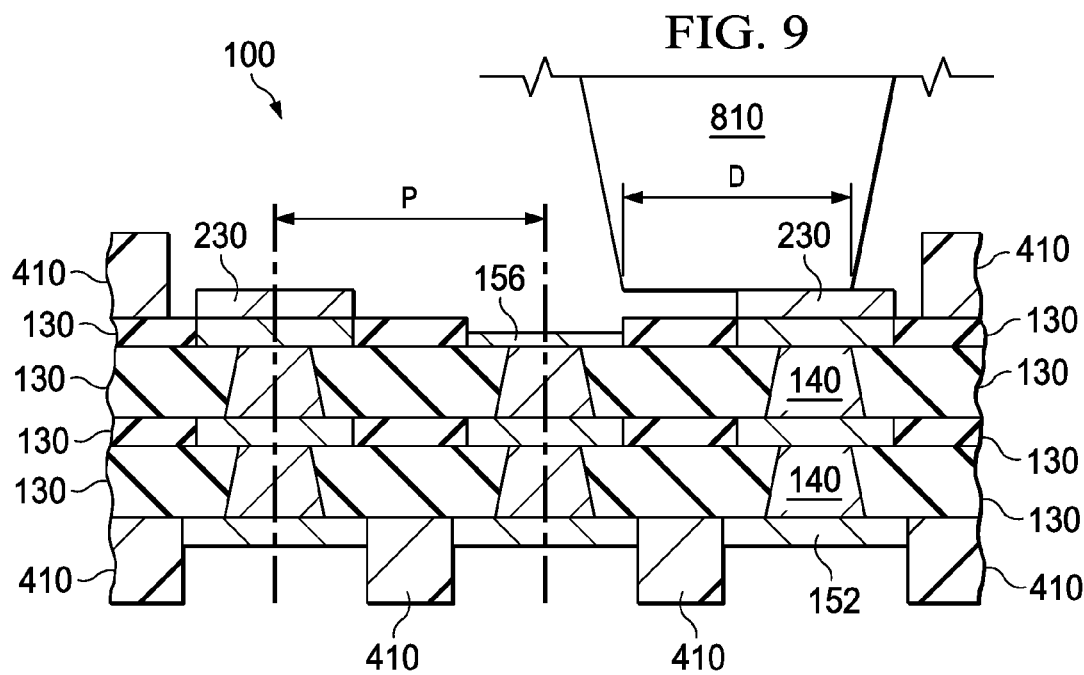
FIG. 9 is a sectional view of the apparatus shown in FIG. 5 in a subsequent stage of manufacture according to one or more aspects of the present disclosure.

FIG. 9 is a sectional view of the apparatus 100 shown in FIG. 5 in which a testing probe 810 has been brought into contact with one of the protrusion bump pads 230 of a conductive pillar 152 of the first subset. The tip of the testing probe 810 may have a diameter D, which may be substantially greater than the pillar pitch P. For example, the pillar pitch P may be about 40 microns, if not smaller, and the testing probe 810 may have a tip diameter D of about 30 microns, if not significantly larger. However, because the conductive pillars 154 of the second subset are recessed, they are not shorted by misalignment of the testing probe 810 relative to the conductive pillars 152 of the first subset.

Figure 10:
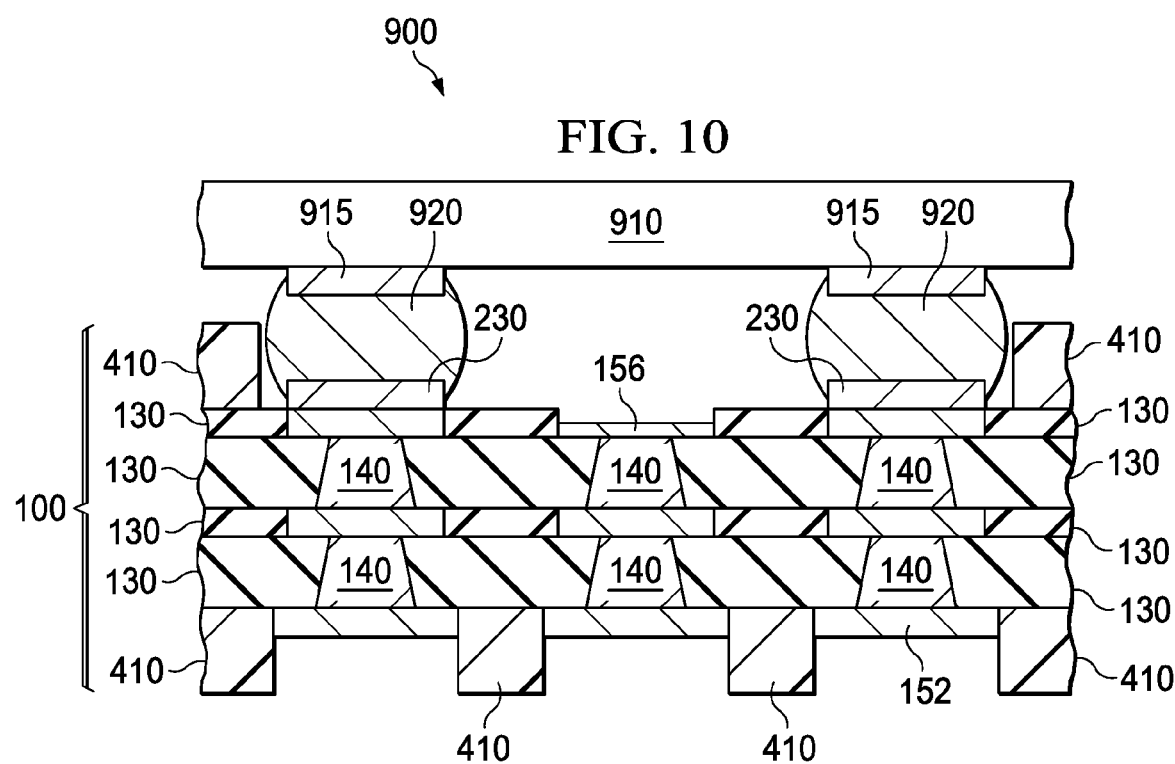
FIG. 10 is a sectional view of the apparatus shown in FIG. 5 in a subsequent stage of manufacture according to one or more aspects of the present disclosure.

FIG. 10 is a sectional view of at least a portion of an apparatus 900 according to one or more aspects of the present disclosure. The apparatus 900 includes the apparatus 100 shown in FIG. 5, a die 910, and a plurality of conductive bumps 920 coupled between the integrated circuit chip and corresponding ones of the bump pads. The die 910 may be or comprise one or more integrated circuit chips, packages, and the like. The conductive bumps 920 may comprise solder, gold, conductive paste, and/or other electrically conductive materials. The die 910 may comprise pads 915 configured to be aligned with the protrusion bump pads 230 prior to be coupled by the conductive bumps 920.

In at least one aspect, embodiments described herein may provide for an apparatus including a substrate and a plurality of conductive traces disposed on a side of the substrate. The apparatus further includes a plurality of conductive members each extending into the substrate from a corresponding one of the conductive traces, and a plurality of bump pads each protruding from one of a first subset of the conductive traces, wherein a second subset of the conductive traces are recessed within the side of the substrate.

In at least another aspect, embodiments described herein may provide for an apparatus including a build-up layer having a topmost surface and a bottommost surface, and a first conductive trace formed at the topmost surface. The apparatus may further include a bump pad protruding from the first conductive trace and extending above the topmost surface, and a second conductive trace at the topmost surface, the second conductive trace having a second topmost surface that is recessed relative the topmost surface of the build-up layer. The apparatus may further include a conductive pillar extending from the first conductive trace to the bottommost surface of the build-up layer.

In yet another aspect, embodiments described herein may provide for an apparatus comprising a plurality of conductive traces disposed on a first side of a build-up layer, and a plurality of bump pads. Respective bump pads protrude from respective ones of a first subset of the conductive traces, and respective ones of a second subset of the conductive traces are recessed within the first side of the build-up layer.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. § 1.72(b) to allow the reader to quickly ascertain the nature of the technical disclosure. It is submitted with the understanding that it will not be used to interpret or limit the scope or meaning of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor structure, the method comprising:
    forming a patterned mask layer on a first side of a build-up layer, wherein the build-up layer comprises:
        a stack of dielectric layers;
        a first conductive pillar embedded in the stack of dielectric layers;
        a second conductive pillar embedded in the stack of dielectric layers; and
        a metal layer extending along an outermost dielectric layer of the stack of dielectric layers, the metal layer disposed between the outermost dielectric layer and the patterned mask layer, wherein the patterned mask layer covers a first portion of the metal layer contacting a first surface of the first conductive pillar while exposing a second portion of the metal layer contacting a second surface of the second conductive pillar; and
    etching the metal layer using the patterned mask layer as an etching mask, wherein after the etching, the first portion of the metal layer remains and the second portion of the metal layer is removed, where etching the metal layer recesses the second surface of the second conductive pillar from a first side of the outermost dielectric layer facing the metal layer.

2. The method of claim 1, wherein each of the first conductive pillar and the second conductive pillar comprises alternating layers of conductive traces and vias, wherein the first conductive pillar comprises a first conductive trace in the outermost dielectric layer, and the second conductive pillar comprises a second conductive trace in the outermost dielectric layer.

3. The method of claim 2, wherein the first surface of the first conductive pillar is an outer surface of the first conductive trace, and the second surface of the second conductive pillar is an outer surface of the second conductive trace.

4. The method of claim 1, wherein forming the patterned mask layer comprises:
    forming a photoresist on the metal layer; and
    removing portions of the photoresist, wherein remaining portions of the photoresist form the patterned mask layer.

5. The method of claim 1, wherein forming the patterned mask layer comprises:
    forming a patterned photoresist on the metal layer, wherein the first portion of the metal layer is exposed by an opening of the patterned photoresist, and the second portion of the metal layer is covered by the patterned photoresist;
    depositing a metal material in the opening of the patterned photoresist; and
    removing the patterned photoresist after depositing the metal material, wherein after removing the patterned photoresist, the deposited metal material forms at least a portion of the patterned mask layer.

6. The method of claim 1, further comprising, after the etching, bonding a semiconductor die to the first portion of the metal layer.

7. The method of claim 6, wherein bonding the semiconductor die comprises forming a solder region between a conductive pad of the semiconductor die and the first portion of the metal layer.

8. The method of claim 6, further comprising, before the bonding, forming a solder resist on the outermost dielectric layer.

9. The method of claim 1, wherein after the etching, a distance between the recessed second surface of the second conductive pillar and the first side of the outermost dielectric layer is less than about 7 µm.

10. The method of claim 1, further comprising:
    forming the build-up layer on a first side of a carrier substrate; and
    removing the build-up layer from the carrier substrate before forming the patterned mask layer.

11. A method of forming a semiconductor structure, the method comprising:
    forming a plurality of dielectric layers over a first side of a carrier substrate;
    forming a first conductive pillar and a second conductive pillar extending through the plurality of dielectric layers, the first conductive pillar comprising a first conductive trace in an uppermost dielectric layer of the plurality of dielectric layers distal the carrier substrate, the second conductive pillar comprising a second conductive trace in the uppermost dielectric layer, the first conductive trace and the second conductive trace having a same thickness as the uppermost dielectric layer;
    covering an upper surface of the uppermost dielectric layer distal the carrier substrate with a metal layer;
    forming a patterned mask layer over the metal layer, the patterned mask layer covering a first portion of the metal layer over the first conductive pillar and exposing a second portion of the metal layer over the second conductive pillar; and
    performing an etching process to remove the second portion of the metal layer from the uppermost dielectric layer, wherein the etching process further removes portions of the second conductive trace such that after the etching process, an upper surface of the second conductive trace facing the metal layer is recessed from the upper surface of the uppermost dielectric layer.

12. The method of claim 11, wherein after the etching process, an upper surface of the first conductive trace facing the metal layer is level with the upper surface of the uppermost dielectric layer.

13. The method of claim 11, wherein after the etching process, the first portion of the metal layer protrudes from the upper surface of the uppermost dielectric layer.

14. The method of claim 13, further comprising, after the etching process, bonding a semiconductor die with the first portion of the metal layer.

15. The method of claim 11, further comprising, before forming the patterned mask layer, removing the carrier substrate.

16. The method of claim 11, wherein the etching process is selective to materials of the first conductive pillar and the second conductive pillar.

17. A method of forming a semiconductor structure, the method comprising:
- forming first dielectric layers and conductive features in the first dielectric layers, wherein portions of the conductive features form a first conductive pillar and a second conductive pillar that extend through the first dielectric layers, wherein the first conductive pillar includes a first conductive trace in an outermost dielectric layer of the first dielectric layers, and the second conductive pillar includes a second conductive trace in the outermost dielectric layer;
- forming a metal layer on an outer surface of the outermost dielectric layer of the first dielectric layers, wherein a first surface of the first conductive trace and a second surface of the second conductive trace are level with the outer surface of the outermost dielectric layer;
- forming a patterned mask layer on the metal layer, wherein the patterned mask layer has an opening exposing a first portion of the metal layer over the first conductive pillar, wherein the patterned mask layer covers a second portion of the metal layer over the second conductive pillars;
- depositing a metal material in the opening of the patterned mask layer over the first portion of the metal layer;
- removing the patterned mask layer from the metal layer after depositing the metal material; and
- performing an etching process after removing the patterned mask layer, wherein the etching process is selective to the metal material, the metal layer, the first conductive pillar, and the second conductive pillar, wherein after the etching process, the outermost dielectric layer is exposed, the first portion of the metal layer is disposed on the first conductive trace, and the second conductive trace is exposed at the outer surface of the outermost dielectric layer.

18. The method of claim 17, wherein after the etching process, the second surface of the second conductive trace is recessed from the outer surface of the outermost dielectric layer.

19. The method of claim 18, wherein after the etching process, the first surface of the first conductive trace is level with the outer surface of the outermost dielectric layer.

20. The method of claim 18, further comprising attaching a semiconductor die to the first portion of the metal layer.

* * * * *